(12) United States Patent
Frey et al.

(10) Patent No.: US 8,058,797 B2
(45) Date of Patent: Nov. 15, 2011

(54) ELECTROLUMINESCENT DEVICE

(75) Inventors: Gitti Frey, Haifa (IL); Kieran J. Reynolds, Cambridge (GB)

(73) Assignee: Cambridge University Technical Services Limited, Cambridge (GB)

( * ) Notice: Subject to any disclaimer, the term of this patent is extended or adjusted under 35 U.S.C. 154(b) by 366 days.

(21) Appl. No.: 10/478,117

(22) PCT Filed: May 16, 2002

(86) PCT No.: PCT/GB02/02306
§ 371 (c)(1),
(2), (4) Date: May 7, 2004

(87) PCT Pub. No.: WO02/095841
PCT Pub. Date: Nov. 28, 2002

(65) Prior Publication Data
US 2004/0178414 A1    Sep. 16, 2004

(30) Foreign Application Priority Data

May 18, 2001  (GB) .................................. 0112138.3
Sep. 27, 2001  (GB) .................................. 0123287.5

(51) Int. Cl.
*H01L 51/50* (2006.01)
*C09K 11/06* (2006.01)

(52) U.S. Cl. ......... 313/504; 313/506; 428/690; 428/917
(58) Field of Classification Search .................. None
See application file for complete search history.

(56) References Cited

U.S. PATENT DOCUMENTS

| | | | | |
|---|---|---|---|---|
| 4,324,803 A | * | 4/1982 | Bergmann et al. | 428/472 |
| 4,996,108 A | | 2/1991 | Divigalpitiya et al. | 428/411.1 |
| 5,279,720 A | | 1/1994 | Divigalpitiya | 204/181.5 |
| 5,958,358 A | * | 9/1999 | Tenne et al. | 423/561.1 |
| 5,981,092 A | * | 11/1999 | Arai et al. | 428/690 |
| 6,023,128 A | | 2/2000 | Grothe et al. | 313/506 |
| 6,180,217 B1 | * | 1/2001 | Ueda et al. | 428/212 |
| 6,555,959 B1 | * | 4/2003 | Nii | 313/506 |
| 2001/0009351 A1 | | 7/2001 | Hosokawa et al. | 313/504 |

FOREIGN PATENT DOCUMENTS

| | | |
|---|---|---|
| EP | 1 083 776 A1 | 3/2001 |
| WO | WO 00/67531 | 11/2000 |

OTHER PUBLICATIONS

Bertrand, Journal of Materials Research, vol. 4, No. 1, (1989), pp. 180-184.*
Ellmer K., Physica Status Solidi (B), (2008), vol. 245, No. 9, pp. 1745-1760.*
Takamichi et al., Mem. Fac. Eng., Osaka City Univ., vol. 43, pp. 1-5 (2002).*
International Search Report in PCT/GB02/02306 dated Dec. 18, 2002.
International Preliminary Examination Report in PCT/GB02/02306 dated Mar. 12, 2003.

* cited by examiner

*Primary Examiner* — Larry Tarazano
*Assistant Examiner* — Brett A Crouse
(74) *Attorney, Agent, or Firm* — Marshall, Gerstein & Borun LLP

(57) ABSTRACT

An electroluminescent device includes a hole injecting electrode, an electron injecting electrode and at least one organic light emitting layer disposed between the hole injecting electrode and the electron injecting electrode wherein a layered metal chalcogenide layer is disposed between the hole injecting electrode and the light emitting layer.

28 Claims, 11 Drawing Sheets

J–V–L data for annealed (•) and unannealed (no marker) Glass/ITO/MoS$_2$/F8BT:TFB/Ca:Al Based Devices
Current Density (dashed line), mA/cm$^2$
Luminance (solid line), cd/m$^2$ J-V-L data for annealed (•) and unannealed (no marker)
Glass/ITO/TaS$_2$/F8BT:TFB/Ca:Al-Based-Devices
Current Density (dashed line), mA/cm$^2$
Luminance (solid line), cd/m$^2$ J−V-L data for annealed (•) and unannealed (no marker)
Glass/ITO/NbSe$_2$/F8BT:TFB/Ca:Al Based Devices
Current Density (dashed line), mA/cm$^2$
Luminance (solid line), cd/m$^2$ J –V-L data for annealed (•) and unannealed (no marker) Glass/ITO/NbSe$_2$/10 min O2 plasma treatment at 250W/F8BT:TFB/Ca:Al Based Devices
Current Density (dashed line), mA/cm$^2$
Luminance (solid line), cd/m$^2$ Efficiency data for annealed (•) and unannealed (no marker) Glass/ITO/NbSe$_2$/10 min O2 plasma treatment at 250W/F8BT:TFB/Ca:Al Based Devices
Power Efficiency (dashed line), lm/W
Light Emission Efficiency (solid line), cd/A J–V-L data for annealed (•) and unannealed (no marker) Glass/ITO/MoS$_2$/10 min O2 plasma treatment at 250W/F8BT:TFB/Ca:Al Based Devices
Current Density (dashed line), mA/cm$^2$
Luminance (solid line), cd/m$^2$ Efficiency data for annealed (•) and unannealed (no marker) Glass/ITO/MoS$_2$/10 min O2 plasma treatment at 250W/F8BT:TFB/Ca:Al Based Devices
Power Efficiency (dashed line), lm/W
Light Emission Efficiency (solid line), cd/A J–V-L data for annealed (•) and unannealed (no marker) Glass/ITO/TaS$_2$/10 min O2 plasma treatment at 250W/F8BT:TFB/Ca:Al Based Devices
Current Density (dashed line), mA/cm$^2$
Luminance (solid line), cd/m$^2$ Efficiency data for annealed (•) and unannealed (no marker) Glass/ITO/TaS$_2$/10 min O2 plasma treatment at 250W/F8BT:TFB/Ca:Al Based Devices
Power Efficiency (dashed line), lm/W
Light Emission Efficiency (solid line), cd/A

ELECTROLUMINESCENT DEVICE

This is the U.S. national phase of International Application No. PCT/GB02/02306 filed May 16, 2002, the entire disclosure of which is incorporated herein by reference.

The present invention relates to novel organic electroluminescent devices which have a novel hole transport layer between the hole generating electrode and the organic light emitting layer. These devices are highly efficient and are easy and cheap to manufacture.

In recent years, there has been considerable interest in light emitting organic materials such as conjugated polymers. Light emitting polymers possess a delocalised pi-electron system along the polymer backbone. The delocalised pi-electron system confers semiconducting properties to the polymer and gives it the ability to support positive and negative charge carriers with high mobilities along the polymer chain. Thin films of these conjugated polymers can be used in the preparation of optical devices such as light-emitting devices. These devices have numerous advantages over devices prepared using conventional semiconducting materials, including the possibility of wide area displays, low dc working voltages and simplicity of manufacture. Devices of this type are described in, for example, WO-A-90/13148, U.S. Pat. No. 5,512,654 and WO-A-95/06400.

The world market for displays based on organic and polymeric light-emitting materials has recently been estimated by Stanford Resources, Inc., to be $ 200 million in the year 2002 with a strong growth rate which fuels the high industrial interest in this area (D. E. Mentley, "Flat Information Displays: Market and Technology Trends", $9^{th}$ edition, 1998). Efficient and highly stable LED devices with low power consumption, which fulfill commercial requirements, have been prepared by a number of companies and academic research groups (see, for example, R. H. Friend et al., *Nature* 1999, 397, 12).

At the moment, great efforts are dedicated to the realization of a full-colour, all plastic screen. The major challenges to achieve this goal are: (1) access to conjugated polymers emitting light of the three basic colours red, green and blue; and (2) the conjugated polymers must be easy to process and fabricate into full-colour display structures. Organic electroluminescent devices such as polymeric LEDs (PLEDs) show great promise in meeting the first requirement, since manipulation of the emission colour can be achieved by changing the chemical structure of the organic emissive compound. However, while modulation of the chemical nature of the emissive layer is often easy and inexpensive on the lab scale it can be an expensive and complicated process on the industrial scale. The second requirement of the easy processability and build-up of full-colour matrix devices raises the question of how to micro-pattern fine multicolour pixels and how to achieve full-colour emission. Inkjet printing and hybrid inkjet printing technology have recently attracted much interest for the patterning of PLED devices (see, for example, R. F. Service, *Science* 1998, 279, 1135; Wudl et al., *Appl. Phys. Lett.* 1998, 73, 2561; J. Bharathan, Y. Yang, *Appl. Phys. Lett.* 1998, 72, 2660; and T. R. Hebner, C. C. Wu, D. Marcy, M. L. Lu, J. Sturm, *Appl. Phys. Lett.* 1998, 72, 519).

At their most basic, organic electroluminescent devices generally comprise an organic light emitting material which is positioned between a hole injecting electrode and an electron injecting electrode. The hole injecting electrode (anode) is typically a transparent tin-doped indium oxide (ITO)-coated glass substrate. The material commonly used for the electron injecting electrode (cathode) is a low work functions metal such as calcium or aluminium.

The materials that are commonly used for the organic light emitting layer include conjugated polymers such as polyphenylene-vinylene (PPV) and derivatives thereof (see, for example, WO-A-90/13148), polyfluorene derivatives (see, for example, A. W. Grice, D. D. C. Bradley, M. T. Bernius, M. Inbasekaran, W. W. Wu, and E. P. Woo, *Appl. Phys. Lett.* 1998, 73, 629, WO-A-00/55927 and Bernius et al., *Adv. Materials,* 2000, 12, No. 23, 1737), polynaphthylene derivatives and polyphenanthrenyl derivatives; and small organic molecules such as aluminium quinolinol complexes (Alq3 complexes: see, for example U.S. Pat. No. 4,539,507) and quinacridone, rubrene and styryl dyes (see, for example, JP-A-264692/ 1988). The organic light emitting layer can comprise mixtures or discrete layers of two or more different emissive organic materials.

Typical device architecture is disclosed in, for example, WO-A-90/13148; U.S. Pat. No. 5,512,654; WO-A-95/06400; R. F. Service, *Science* 1998, 279, 1135; Wudl et al., *Appl. Phys. Lett.* 1998, 73, 2561; J. Bharathan, Y. Yang, *Appl. Phys. Lett.* 1998, 72, 2660; T. R. Hebner, C. C. Wu, D. Marcy, M. L. Lu, J. Sturm, *Appl. Phys. Lett.* 1998, 72, 519); and WO 99/48160; the contents of which references are incorporated herein by reference thereto.

The injection of holes from the hole injecting layer such as ITO into the organic emissive layer is controlled by the energy difference between the hole injecting layer work function and the highest occupied molecular orbital (HOMO) of the emissive material, and the chemical interaction at the interface between the hole injecting layer and the emissive layer. The deposition of high work function organic materials on the hole injecting layer, such as poly(styrene sulfonate)-doped poly (3,4-ethylene dioxythiophene) (PEDOT/PSS), N,N'-diphenyl-N,N'-(2-naphthyl)-(1,1'-phenyl)4,4'-diamine (NBP) and N,N'-bis(3-methylphenyl)-1,1'-biphenyl4,4'-diamine (TPD), provides "hole transport" layers which facilitate the hole injection into the light emitting layer, transport holes stably from the hole injecting electrode and obstruct electrons. These layers are effective in increasing the number of holes introduced into the light emitting layer. However, the surface of ITO is not well defined and the chemistry at the interface with these conventional hole transport materials is hard to control.

As an alternative to the high work function organic materials such as PEDOT/PSS, high resistivity inorganic layers have been proposed for use as hole transport layers in, for example, EP-A-1009045, EP-A-1022789, EP-A-1030539 and EP-A-1041654. EP-A-1022789 discloses an inorganic hole transport layer which is capable of blocking electrons and has conduction paths for holes. The layer has a high resistivity, stated to be preferably in the region of $10^3$ to $10^8$ Ω-cm. The materials which are disclosed have the general formula $(Si_{1-x}Ge_x)O_y$, wherein $0 \leq x \leq 1$ and $1.7 \leq y \leq 2.2$. The work function of this hole transport layer is not well defined and is likely to vary depending upon the actual identity of x and y. EP-A-1083776 and EP-A-1111967 disclose EL devices having an inorganic hole transport layer that comprises a combination of a metal chalcogenide and an inorganic compound of an element of Group 5A to Group 8 of the periodic table. It is essential that both components are present to provide the desired effect of tuning the work function and there is no suggestion that the metal chalcogenides should be layered metal chalcogenides. U.S. Pat. No. 6,023,128 discloses an EL device having a hole transport layer comprising a matrix in which are embedded transition metal chalcogenide clusters which are stabilised by organic ligand shells. Tuning of the electronic properties is achieved through the quantum size effect exerted by these clusters. There is no disclosure of the use of single continuous layers of a layered metal chalcogenide as a hole transport layer.

There is still a need, however, for a hole transport material which is superior to these prior art materials, especially one which is chemically inert at the interface with the organic light emitting layer and which has properties which would enable the simple, low cost manufacture of devices which have excellent power efficiency, a low drive voltage and a high level of luminance.

It is therefore an object of the present invention to provide an electroluminescent device which incorporates a novel inorganic hole transport layer, said electroluminescent device having superior properties both in its ease of manufacture and in its performance.

Thus, in a first aspect of the present invention there is provided an electroluminescent device comprising a hole injecting electrode, an electron injecting electrode and at least one organic light emitting layer disposed between said hole injecting electrode and said electron injecting electrode, wherein a layered metal chalcogenide layer is disposed between said hole injecting electrode and said light emitting layer, the chalcogen component of said chalcogenide being chosen from sulfur, selenium and tellurium.

The layered metal chalcogenides are a well-known class of compounds (e.g. see Physics and Chemistry of Materials With Layered Structures, pub. D. Reidel/Dordrecht-Holland/Boston-USA) and include any compounds comprising metal atoms and chalcogen atoms chosen from sulfur, selenium and tellurium in a layer-type structure. Examples include layered metal dichalcogenides and layered metal monochalcogenides. The layered metal dichalcogenides have the chemical formula $MX_2$ wherein M represents a metal and X represents sulfur, selenium or tellurium. The structure of the layered metal dichalcogenides preferably includes one sheet of metal atoms sandwiched between two sheets of chalcogen atoms. In the layered metal dichalcogenides, the metallic component M is preferably selected from transition metals such as titanium, zirconium, hafnium, vanadium, tantalum, niobium, molybdenum and tungsten and non-transition metals such as tin. More preferred are niobium, molybdenum, tantalum, tin and tungsten, and most preferred are niobium, molybdenum and tantalum. More preferred chalcogens are sulfur and selenium. Metals that form monochalcogenides include gallium, indium and thallium.

As we explain in greater detail below, the layered metal chalcogenides have several properties which make them particularly suitable for use as hole transport layers. They are chemically inert, having no dangling bonds, thus overcoming the problems of chemical interactions experienced at the interfaces of the prior art hole transporting layers referred to above with the organic light emitting layer and the anode. The layered metal chalcogenides have a high work function which enables easier transfer of the holes from the metal chalcogenide layer to the organic light emitting layer. Furthermore, they can be processed simply and cheaply using chemical processes to give thin films.

The structure of the metal chalcogenides comprises sheets of metal atoms sandwiched between sheets of chalcogen atoms. In the layered metal dichalcogenides, for example, the metallic sheet is covalently bonded to the two adjacent sheets of chalcogens. Two adjacent $MX_2$ layers are kept together by van der Waals forces. This structure leads to extremely anisotropic mechanical, chemical and electrical properties. Exposed surfaces of these materials have no dangling bonds and, hence, are chemically inert. This makes them particularly suitable for use as hole transport layers in electroluminescent devices as it removes the problem of chemical reactions at the interfaces with the hole injecting layer (e.g. ITO) and the organic light emitting layer (e.g. PPV) which reduce the efficiency and effective lifetime of the prior art devices.

The layered metal chalcogenides exhibit high work functions in the range 4-6.5 eV, and 5-6.5 eV is particularly preferred. For example, the work functions of niobium diselenide, molybdenum disulfide, tin disulfide, tantalum disulfide, vanadium diselenide, indium selenide and gallium selenide are 5.9, 4.8, 5.2, 5.2, 5.6, 4.55 and 5.8 eV, respectively [measured by a photoemission technique as disclosed in T. Shimada, F. S. Ohuchi and B. A. Parkinson, *Jap. J. App. Phys.* 33, 2696 (1994)]. The high work function of these materials makes them particularly suitable for use as hole transport layers, as these work functions are close in value to the ionization potentials of the organic light emitting layers, facilitating easy hole transfer to said emissive layer. The high work function, reasonable conductivity and the inertness of exposed surfaces of the layered metal chalcogenides greatly facilitate hole injection from the hole injecting electrode (e.g. ITO) into the emissive layer in the electroluminescent device of the present invention, making the devices particularly efficient.

The electronic properties of the layered metal chalcogenides vary widely, from insulators through semiconductors and semi-metals to true metals. The resistivity of the layered metal chalcogenides ranges from very low values such as approximately $4 \times 10^{-4}$ Ω-cm for niobium diselenide and tantalum disulfide to values such as 10 Ω-cm in molybdenum disulfide. As already noted above, prior disclosures of inorganic hole transport layers, such as those in EP-A-1022789, teach preferred resistivities of $1 \times 10^3$-$1 \times 10^8$ Ω-cm. The low resistivity exhibited by some of the layered metal chalcogenides may result in a reduction in the required drive voltage for some of the devices of the present invention.

The structure of the layered metal dichalcogenides includes one hexagonal packed sheet of metal atoms sandwiched between two hexagonal sheets of chalcogen atoms. The coordination of the metal atoms by the chalcogen atoms is either hexagonal (e.g. titanium disulfide and vanadium disulfide) or trigonal prismatic (e.g. molybdenum disulfide and niobium disulfide). The $MX_2$ layers are kept together by van der Waals forces and several stacking polytypes exist (see FIG. 1). The weak bonding between layers, where a layer consists of a monolayer of metal atoms clad together by covalentely-bonded chalcogens, leads to extremely anisotropic mechanical and electrical properties. For example, the conductivity perpendicular to the planes is down by a factor of at least $10^2$ on that in the planes for molybdenum disulfide [see J. A. Wilson and A. D. Yoffe, *Adv. Phys.* 18, 193 (1969)].

The structure of the layered metal monochalcogenides includes two hexagonal packed sheets of metal atoms sandwiched between two hexagonal sheets of chalcogen atoms in the sequence -X-M-M-X. In the binary compounds, the cations prefer the tetrahedral coordination. The bonding in the X-M-M-X layer is covalent. The metal-metal bonds are responsible for the semiconducting behavior of these materials. The layers are kept together by van der Waals forces and several stacking polytypes exist. The weak bonding between layers leads to extremely anisotropic mechanical and electrical properties.

The coordination and the oxidation state of the metal atom determine the electronic properties of the material. For example, the group V metal atoms (niobium and tantalum) are in a trigonal prismatic coordination and the corresponding dichalcogenide materials are metals, while group VI atoms (molybdenum and tungsten) are also in a trigonal prismatic coordination but have a full $d_{z}$ band and hence are semiconductors. Molybdenum disulfide has both a hexagonal and a trigonal prismatic coordination, and can thus be either metallic or semiconducting respectively.

The absorption spectra of the metallic metal chalcogenides shows that the materials absorb throughout the IR and visible region. However, for thin films of trigonal prismatic materials such as niobium diselenide, the free carrier absorption is below 1 eV and is well separated from the direct absorption edge above 2 eV [see J. A. Wilson and A. D. Yoffe, *Adv. Phys.* 18, 193 (1969)]. Therefore, by processing very thin films of the layered metal chalcogenides, their absorption of the emission is minimized. Thus, although the thickness of the layer is not critical, the layered metal chalcogenide hole transport layer preferably has a thickness of from 3 to 20 nm, more preferably from 3 to 10 nm, and most preferably from 3 to 7 nm. Thicker films, although still effective, can absorb greater than 20% of the emitted light and thus decrease the light emission.

Preferably, the layered metal chalcogenide is the only hole transporting material. Furthermore, it should be understood that the layered metal chalcogenide hole transport layer forms a single continuous thin sheet on the hole injecting electrode, c.f. the clusters suspended in a matrix disclosed in U.S. Pat. No. 6,023,128.

Particularly good properties can be obtained in some cases if the layered metal chalcogenide hole transport layer is annealed at a temperature of at least 100° C. (e.g. 250° C.) before the emissive layer is deposited on it, as it improves the order in the film of some of the layered metal chalcogenide materials and enhances their conductivity.

The light emitting layer can comprise one or more organic light emitting materials. Where there is more than one organic light emitting material, these can be disposed as separate, discrete layers or as mixtures of said materials in a single layer. Any organic light emitting materials can be used for the light emitting layer. Suitable examples include: conjugated polymers such as poly-phenylene-vinylene (PPV) and derivatives thereof (see, for example, WO-A-90/13148), polyfluorene derivatives (see, for example, A. W. Grice, D. D. C. Bradley, M. T. Bernius, M. Inbasekaran, W. W. Wu, and E. P. Woo, *Appl. Phys. Lett.* 1998, 73, 629, WO-A-00/55927 and Bernius et al., *Adv. Materials,* 2000, 12, No. 23, 1737), polynaphthylene derivatives, polyindenofluorene derivatives and polyphenanthrenyl derivatives; and small organic molecules such as aluminium quinolinol complexes (Alq3 complexes: see, for example U.S. Pat. No. 4,539,507), complexes of transition metals, lanthanides and actinides with organic ligands such as TMHD (see WO-A-00/26323) and quinacridone, rubrene and styryl dyes (see, for example, JP-A-264692/1988); the contents of which references are incorporated herein by reference thereto.

Specific examples of preferred light emitting polymeric materials include polymers which include the following conjugated units of formulae (VII), (IX), (X), (XI), (XII), (XIII), (XIV) and (XV). These polymers can be homopolymers or can contain two or more different conjugated units, e.g. alternating AB copolymers and terpolymers, and statistical copolymers and terpolymers.

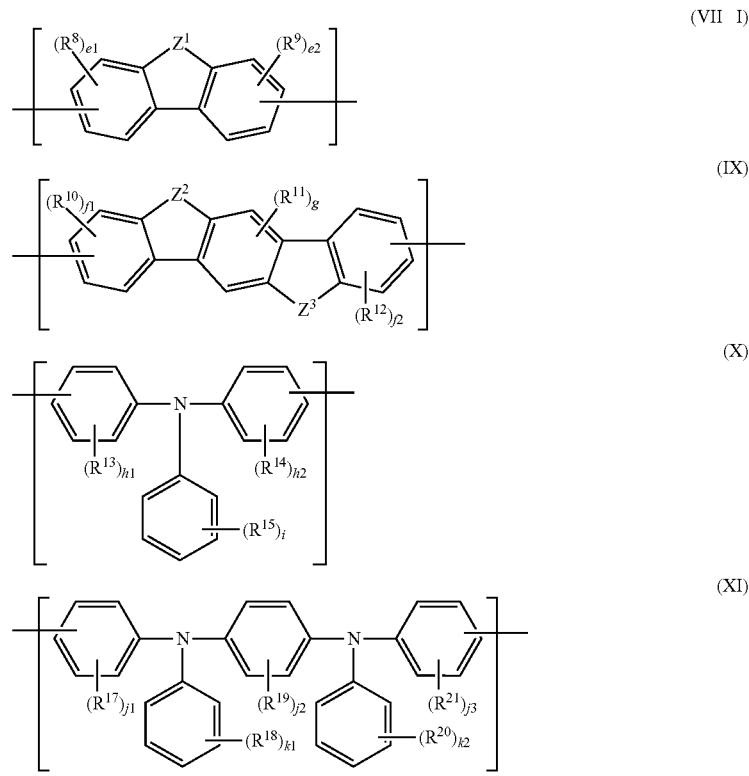

-continued

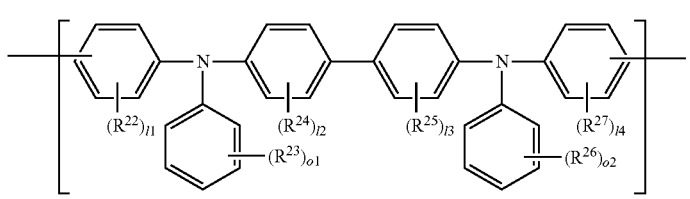
(XII)

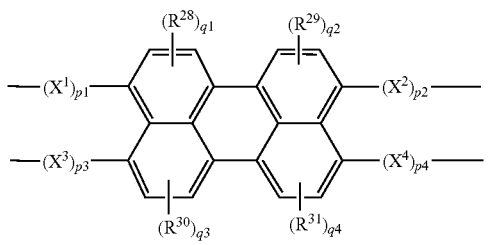
(XIII)

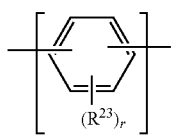
(XIV)

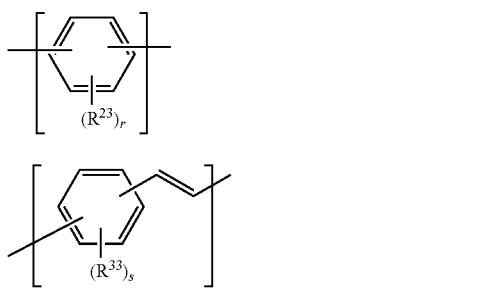
(XV)

wherein:

each of $R^8$ to $R^{15}$ and $R^{17}$ to $R^{33}$ is the same or different and is selected from the group consisting of alkyl groups as defined below, haloalkyl groups as defined below, alkoxy groups as defined below, alkoxyalkyl groups as defined below, aryl groups as defined below, aryloxy groups as defined below, aralkyl groups as defined below and groups of formula —$COR^{16}$ wherein $R^{16}$ is selected from the group consisting of hydroxy groups, alkyl groups as defined below, haloalkyl groups as defined below, alkoxy groups as defined below, alkoxyalkyl groups as defined below, aryl groups as defined below, aryloxy groups as defined below, aralkyl groups as defined below, amino groups, alkylamino groups the alkyl moiety of which is as defined below, dialkylamino groups wherein each alkyl moiety is the same or different and is as defined below, aralkyloxy groups the aralkyl moiety of which is as defined below and haloalkoxy groups comprising an alkoxy group as defined below which is substituted with at least one halogen atom, or, where r or s is an integer of 2, the 2 groups $R^{32}$ or $R^{33}$ respectively may, together with the ring carbon atoms to which they are attached, form a heterocyclic group having from 5 to 7 ring atoms, one or more of said ring atoms being a heteroatom selected from the group consisting of nitrogen, oxygen and sulfur atoms;

each of $Z^1$, $Z^2$ and $Z^3$ is the same or different and is selected from the group consisting of O, S, SO, $SO_2$, $NR^3$, $N^+(R^{3'})(R^{3''})$, $C(R^4)(R^5)$, $Si(R^{4'})(R^{5'})$ and $P(O)(OR^6)$, wherein $R^3$, $R^{3'}$ and $R^{3''}$ are the same or different and each is selected from the group consisting of hydrogen atoms, alkyl groups as defined below, haloalkyl groups as defined below, alkoxy groups as defined below, alkoxyalkyl groups as defined below, aryl groups as defined below, aryloxy groups as defined below, aralkyl groups as defined below, and alkyl groups as defined below which are substituted with at least one group of formula —$N^+(R^7)_3$ wherein each group $R^7$ is the same or different and is selected from the group consisting of hydrogen atoms, alkyl groups as defined below and aryl groups as defined below, $R^4$, $R^5$, $R^{4'}$ and $R^{5'}$ are the same or different and each is selected from the group consisting of hydrogen atoms, alkyl groups as defined below, haloalkyl groups as defined below, alkoxy groups as defined below, halogen atoms, nitro groups, cyano groups, alkoxyalkyl groups as defined below, aryl groups as defined below, aryloxy groups as defined below and aralkyl groups as defined below or $R^4$ and $R^5$ together with the carbon atom to which they are attached represent a carbonyl group, and $R^6$ is selected from the group consisting of hydrogen atoms, alkyl groups as defined below, haloalkyl groups as defined below, alkoxyalkyl groups as defined below, aryl groups as defined below, aryloxy groups as defined below and aralkyl groups as defined below;

each of $X^1$, $X^2$, $X^3$ and $X^4$ is the same or different and is selected from:

arylene groups which are aromatic hydrocarbon groups having from 6 to 14 carbon atoms in one or more rings which may optionally be substituted by at least one substituent selected from the group consisting of nitro groups, cyano groups, amino groups, alkyl groups as defined below, haloalkyl groups as defined below, alkoxyalkyl groups as defined below, aryloxy groups as defined below and alkoxy groups as defined below;

straight or branched-chain alkylene groups having from 1 to 6 carbon atoms;

straight or branched-chain alkenylene groups having from 2 to 6 carbon atoms; and straight or branched-chain alkynylene groups having from 1 to 6 carbon atoms; or $X^1$ and $X^2$ together and/or $X^3$ and $X^4$ together can represent a linking group of formula (V) below:

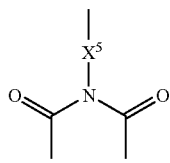

(V)

wherein X⁵ represents an arylene group which is an aromatic hydrocarbon group having from 6 to 14 carbon atoms in one or more rings which may optionally be substituted by at least one substituent selected from the group consisting of nitro groups, cyano groups, amino groups, alkyl groups as defined below, haloalkyl groups as defined below, alkoxyalkyl groups as defined below, aryloxy groups as defined below and alkoxy groups as defined below;

each of e1, e2, f1 and f2 is the same or different and is 0 or an integer of 1 to 3;

each of g, q1, q2, q3 and q4 is the same or different and is 0, 1 or 2;

each of h1, h2, j1, j2, j3, l1, l2, l3, l4, r and s is the same or different and is 0 or an integer of 1 to 4;

each of i, k1, k2, o1 and o2 is the same or different and is 0 or an integer of 1 to 5; and each of p1, p2, p3 and p4 is 0 or 1;

the alkyl groups above are straight or branched-chain alkyl groups having from 1 to 20 carbon atoms;

the haloalkyl groups above are alkyl groups as defined above which are substituted with at least one halogen atom;

the alkoxy groups above are straight or branched-chain alkoxy groups having from 1 to 20 carbon atoms;

the alkoxyalkyl groups above are alkyl groups as defined above which are substituted with at least one alkoxy group as defined above; and the aryl group above and the aryl moiety of the aralkyl groups (which have from 1 to 20 carbon atoms in the alkyl moiety) and the aryloxy groups above is an aromatic hydrocarbon group having from 6 to 14 carbon atoms in one or more rings which may optionally be substituted with at least one substituent selected from the group consisting of nitro groups, cyano groups; amino groups; alkyl groups as defined above, haloalkyl groups as defined above, alkoxyalkyl groups as defined above and alkoxy groups as defined above.

The particularly preferred light emitting polymers include homopolymers, copolymers and terpolymers which comprise groups of formulae (VIII), (IX), (X), (XIV) and (XV), examples of which include PPV, poly(2-methoxy-5-(2'-thyl) hexyloxyphenylene-vinylene) ("MEH-PPV"), PPV derivatives such as dialkoxy and dialkyl derivatives, polyfluorene derivatives and related copolymers; and the most preferred polymers include PPV, MEH-PPV, poly (2,7-(9,9-di-n-hexylfluorene)), poly (2,7-(9,9-di-n-octylfluorene)), poly (2,7-(9,9-di-n-octylfluorene)-(1,4-phenylene-((4-sec-butylphenyl)imino)-1,4-phenylene)) ("TFB"), and poly (2,7-(9,9-di-n-octylfluorene)-3,6-benzothiadiazole) ("F8BT"). The most preferred light emitting organic molecules include Alq3 complexes.

The thickness of the light emitting layer or layers is not critical. The precise thickness of the layer or layers will vary depending upon factors such as the identity of the material or materials of the light emitting layer or layers and the identity of the other components of the device. However, typically the thickness of the light emitting layer (or combined thickness if there is more than one layer) is from 1 to 250 nm, preferably from 50 to 120 nm, yet more preferably from 70 to 100 nm, and most preferably from 75 to 85 nm.

The organic light emitting layer can be deposited on the layered metal chalcogenide hole transport layer using any method suitable for the deposition of such organic layers. As the layered metal chalcogenides are not soluble in organic solvents, spin coating from solution of the organic light emitting material is particularly suitable for this purpose (see, for example, WO-A-90/13148).

The electroluminescent device of the present invention may typically have the stacked configuration of substrate (e.g. glass), a hole injecting electrode (e.g. ITO), a layered metal chalcogenide hole transport layer, an organic light emitting layer (e.g. a polyfluorene), and an electron injecting electrode (e.g. Ca/Al). Alternatively, the device may have the inversely stacked configuration of substrate, an electron injecting electrode, an organic light emitting layer, a layered metal chalcogenide hole transport layer, and a hole injecting electrode.

Any suitable technique known in the art may be employed to deposit the layered metal chalcogenide hole transport layer on the anode. However, the chemical route is preferred since ultra thin films can be deposited on the anode in a low cost process.

A suitable chemical process for depositing the layered metal dichalcogenides on the anode is based on one developed by Frindt et al. [see P. Joensen, R. F. Frindt and S. R. Morrison, *Mat. Res. Bull.* 21, 457 (1986) and U.S. Pat. No. 4,996,108]. This process involves the following steps:

(a) intercalation of lithium atoms into the $MX_2$ compounds;

(b) addition of water to the intercalated material, resulting in the reduction of the water by the lithium atoms. The resulting hydrogen gas which is evolved between the $MX_2$ layers breaks up the stacking of the layers (exfoliation) and single layers of $MX_2$ which are suspended in the water are produced as a result;

(c) addition of a water immiscible solvent to the single layer water suspension of $MX_2$, followed by agitation of the resulting mixture, producing a thin film of $MX_2$ which is formed at the solvent/water interface; and (d) dipping the lower end of a wet ITO-coated glass substrate into the solvent/water interface, resulting in the spread of the $MX_2$ film as a thin oriented film on the ITO surface. The $MX_2$ films are oriented with the c-axis perpendicular to the ITO-coated substrate.

The layered metal chalcogenide hole transport layer provides excellent conduction paths for holes generated by the hole injecting electrode. Some of the layered metal chalcogenides which are-semiconducting materials-may also be capable to some extent of blocking electrons from escaping from the light emitting organic layer, thus helping to balance the electron and hole currents in the light emitting layer and to enhance their capture. However, the ability to block electrons can be greatly enhanced by depositing a layer of a material, capable of restraining migration of electrons from the emissive layer, between the inorganic layered metal chalcogenide hole transport layer and the light emitting organic layer.

Thus, in a particularly preferred embodiment of the device of the invention, there is provided a layer of a material between the organic light emitting layer and layered metal chalcogenide hole transport layer which is capable of restraining migration of electrons from said organic light emitting layer to said layered metal chalcogenide hole transport layer. This material can, for example, be one of the materials known from the prior art to be capable of restraining migration of electrons from the organic light emitting layer, e.g. the oxides, carbides, nitrides, silicides and borides of metals and metalloids which are disclosed in EP-A-1022789 and EP-A-1041654, such as those of general formula $(Si_{1-x}Ge_x)O_y$ wherein $0 \leqq x \leqq 1$ and $1.7 \leqq y \leqq 2.2$.

It is particularly preferable, however, for the thin layer of material that is capable of restraining migration of electrons to be an oxide of the same metal as that of said metal chalcogenide layer. These metal oxides act as highly effective electron blockers. Furthermore, the deposition of the metal oxide layer is very simple as it can be effected by oxidising the exposed surface of the layered metal chalcogenide layer after its deposition on the hole injecting layer. The metal oxide can be stoichiometric or non-stoichiometric; the actual composition of the oxide layer may vary depending upon the oxidation conditions used to produce said layer. Additionally, the polymer solutions wet the metal oxide layers much better than the layered metal chalcogenide layers, resulting in fewer pin holes and lower leakage currents (i.e. higher efficiencies).

These preferred organic electroluminescent devices which incorporate the metal oxides (MOs) on the layered metal chalcogenide (LMC) layer have the following typical structure: glass/ITO/LMC/MO/organic light emitting layer/Ca/Al. Such devices have a low manufacturing cost, a low operating voltage and are highly efficient.

Methods for the deposition of the electron blocking metal oxide film include various physical and chemical film forming methods such as sputtering and evaporating. Oxidation of the layered metal chalcogenide layer in an oxygen plasma generator is particularly preferable. Typical oxidation is carried out in an RF oxygen plasma generator at 0.3-0.5 mbar oxygen pressure and 250 W. The length of treatment in the plasma generator controls the thickness of the oxide film. The preferred thickness of the metal oxide film will vary depending upon the nature of the device and it is not critical to the efficiency of the device. However, particularly efficient electron-hole balancing is achieved in devices comprising a 1-10 nm metal oxide film; metal oxide films having a thickness of 2 to 6 nm are more preferred; and metal oxide films having a thickness of 2-3 nm are most preferred. Films having a thickness of less than 1 nm can have reduced effectiveness in electron blocking while hole injection into the organic light emitting layer can be less efficient in some instances in films having a thickness of greater than 4 nm. The oxidation rate depends on the LMC/MO material involved and the generator set-up.

In devices which include an electron blocking thin film such as an oxide of the metal of the layered metal chalcogenide layer, the organic light emitting layer is deposited on the electron blocking film layer. Since the layered metal chalcogenide and metal oxide layers are non-soluble in organic solvents, the organic emitting layer can be deposited by spin coating from solution onto the inorganic layer, which is a simple and low-cost procedure.

In some devices, an "electron transport" layer is also provided between the electron injecting layer and the light emitting layer (e.g. suitable compounds include oxides of alkali metals, alkaline earth metals or lanthanoid elements having a work function of up to 4 eV, such as those disclosed in EP-A-1009045). These facilitate the electron injection into the light emitting layer, they transport electrons stably from the electron injecting layer and they obstruct holes. These layers are effective for increasing the number of electrons into the light emitting layer. Particularly preferred are strontium oxide, magnesium oxide, calcium oxide, lithium oxide, rubidium oxide, potassium oxide, sodium oxide and cesium oxide. The thickness of the electron transport layer will vary depending upon the material of which it is comprised, but it is typically from 0.1 to 2 nm and preferably from 0.3 to 0.8 nm.

The substrate on which the organic electroluminescent device of the present invention can be formed is any which is typically used in such devices, examples of which include glass, quartz and crystalline substrates of Si, GaAs, ZnSe, ZnS, GaP and InP. Of these, glass substrates are particularly preferred.

The hole injecting electrode can be formed from any material typically used for this purpose in electroluminescent devices. Examples of suitable materials include tin-doped indium oxide (ITO), zinc-doped indium oxide (IZO), indium oxide, tin oxide and zinc oxide, of which ITO is particularly preferred. The thickness of the hole injecting electrode will vary depending upon the identity of the bole injecting material and of the other components of the electroluminescent device. Typically, the electrode has a thickness of from 50 to 500 nm, particularly from 50 to 300 nm.

The electron injecting electrode can be formed from any material typically used for this purpose in electroluminescent devices. Examples of suitable materials include low work function metals such as potassium, lithium, sodium, magnesium, lanthanum, cerium, calcium, strontium, barium, aluminium, silver, indium, tin, zinc and zirconium, and binary or ternary alloys containing such metals. Of these, successive layers of aluminium and calcium and aluminium-calcium alloys containing from 1 to 20% by weight of calcium are preferred. The thickness of the electron injecting electrode will vary depending upon the identity of the electron injecting material and of the other components of the electroluminescent device. Typically, the electrode has a thickness of from 0.1 to 500 nm, preferably at least 1 nm.

The typical organic electroluminescent devices of the present invention include an an inorganic layered metal chalcogenide hole transport layer, an inorganic metal-oxide electron blocking layer, and an organic light emitting layer sandwiched between the anode and cathode. These devices are cheap to manufacture because the processes needed to deposit the layers are simple and most of the layered metal chalcogenides are inexpensive and readily available. In particular, the all-chemical inexpensive device processing techniques outlined above offer an easy-to-prepare, low-cost device. The electroluminescent devices of the present invention are highly efficient, with a power efficiency of greater than 10 Lum/Watt in some devices, and remarkably bright, with a luminance at 6V of greater than 60,000 $Cd/m^2$ in some devices. The hybrid organic/inorganic device has both the advantages of the organic materials and the inorganic materials, and the outstanding performance of the devices of the present invention demonstrates organic/inorganic synergism.

The present invention may be further understood by consideration of the following examples, with reference to the following drawings in which.

Figure 1:
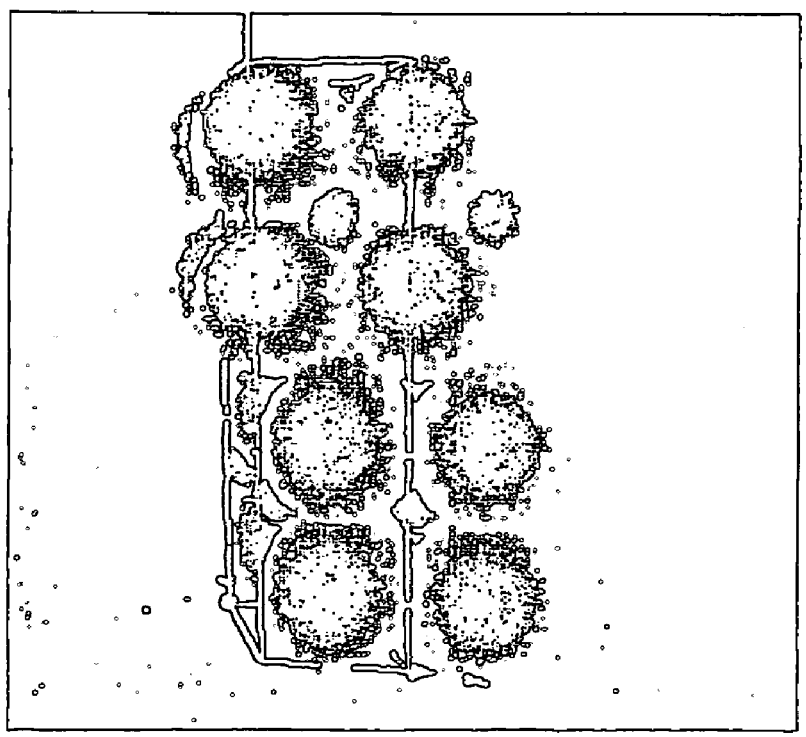
FIG. 1 shows the atomic structure of 2H—$MoS_2$.

We shall first describe a process for the production of the substrate/hole injecting layer/layered metal chalcogenide hole transport layer structure, and then describe the production of two alternative types of organic electroluminescent devices based on this structure, one with and one without a metal oxide layer between the layered metal chalcogenide layer and the organic light emitting layer. In these examples, the layered metal chalcogenides employed are all layered metal dichalcogenides.

Li Intercalation, Exfoliation and Film Formation:

Intercalation n-Butyllithium (Bu-Li) in hexane solution was used for the intercalation of lithium atoms into the layered metal dichalcogenide compounds. In a typical reaction, 0.5 g of commercial layered metal dichalcogenide (MX$_2$) powder was soaked in 1.6M Bu-Li in hexane under argon in dried Schlenkware for 3 days in a procedure based on that disclosed in D. W. Murphy, F. J. Di Salvo, G. W. Hull Jr. and J. V. Waszczak, *Inorg. Chem.* 15, 17 (1976). The intercalation reaction is as follows:

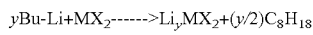

$$yBu\text{-}Li+MX_2 \longrightarrow Li_yMX_2+(y/2)C_8H_{18}$$

The product, Li$_y$MX$_2$, was washed in anhydrous hexane, dried under vacuum, then transferred and stored in a glove box. In the intercalated compounds, the lithium atoms are situated in the van der Waals gap between the MX$_2$ layer [see R. H. Friend and A. D. Yoffe, *Adv. Phys.* 36, 1 (1987)].

Exfoliation

The process used is based on that described in P. Joensen, R F. Frindt and S. R. Morrison, *Mat. Res. Bull.* 21, 457 (1986) and U.S. Pat. No. 4,996,108. A vial was loaded in the glove box with 15-20 mg of the Li$_y$MX$_2$ produced in the intercalation step above and then taken out. Immediately, 5-10 ml of deionised water were added and the solution was sonicated (typically for 1 hour). An exfoliation reaction takes place as follows:

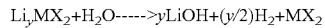

$$Li_yMX_2+H_2O \longrightarrow yLiOH+(y/2)H_2+MX_2$$

The hydrogen gas evolved in between the MX$_2$ layers breaks up the stacking of the layers producing single layers of MX$_2$ (SL) which are suspended in the water. The SL suspension was centrifuged and the sediment was washed/agitated and centrifuged again until the pH of the supernatant was lowered to 7 indicating there was no lithium hydroxide left in the sediment.

Film Forming:

The process used is based on that described in P. Joensen, R. F. Frindt and S. R. Morrison, *Mat. Res. Bull.* 21, 457 (1986) and U.S. Pat. No. 4,996,108. 3 ml of deionised water were added to the SL sediment and the suspension sonicated for several minutes. 2-3 ml of xylene or toluene were then added to the sonicated SL suspension. The solvents do not mix and the inorganic material is in the water (lower) phase. Once the vial was shaken, a thin MX$_2$ film grew on the interface between the water and the organic solvent and also climbed up the walls of the vial. It should be noted that in some instances, further sonications may be performed after addition of the solvent and before shaking, depending on the nature of the materials used and the type of film wanted. A wetted, clean and oxygen plasma treated ITO coated glass substrate (prepared as described in, for example, WO-A-90/13148; 1, 2 in FIGS. 2 and 6) was then dipped into the interface. The MX$_2$ thin film (3 in FIGS. 2 and 6) at the interface spread on to the substrate. The thickness of the film was controlled by the concentration of the SL suspension, and was typically 4-7 nm [determined by AFM (atomic force spectroscopy) and XPS (X-ray photoelectron spectroscopy) measurements].

Device Structure

The thin film of organic light emitting material can be coated onto the surface of the inorganic layer produced above using any technique suitable for this purpose. Spin coating from solutions of polymer in organic solvents (disclosed, for example, in WO-A-90/13148) is particularly preferred. In the following examples, a polyfluorene blend of poly (2,7-(9,9-di-n-octylfluorene)-(1,4-phenylene-((4-sec-butylphenyl) imino)-1,4-phenylene)) ("TFB"), and poly (2,7-(9,9-di-n-octylfluorene)-3,6-benzothiadiazole) ("F8BT") [F8BT:TFB (3:1)] in xylene at a concentration of 15 mg/ml was spun on the inorganic layer of the coated substrate produced as described above (spinning took place at 2500 rpm for 60 seconds, gradual acceleration being employed to reach the final spinning speed) to yield a film thickness of 75-80 nm (4 in FIGS. 2 and 6).

To complete the device, the electron injecting layer was then deposited on the upper surface of the organic light emitting film deposited on the hole transport layer as described above. Any material suitable for use as an electron injecting material can be used, and examples of such materials and means for their deposition are given above. In the present examples a layer of calcium (5 in FIGS. 2 and 6) was first deposited by evaporation at a pressure of $<8 \times 10^{-6}$ mbar on the surface of the polymer film followed by evaporation thereon of a layer of aluminium (6 in FIGS. 2 and 6) at a pressure of $<5 \times 10^{-6}$ mbar.

In these examples, two sets of devices were fabricated.

Figure 2:
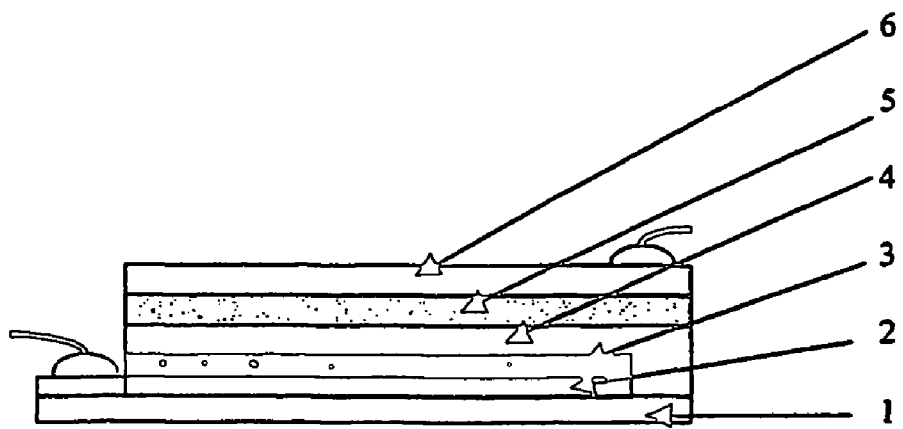
FIG. 2 shows a schematic representation of an electroluminescent device according to the present invention having a layered metal dichalcogenide hole transport layer.

In the first set of devices, molybdenum disulfide, niobium diselenide or tantalum disulfide were deposited on the ITO layer so as to act as the hole transport layer before depositing the polymer layer (i.e. there was no oxide layer between the metal dichalcogenide layer and the polymer layer) as shown in FIG. 2 (not to scale). In addition, for each metal dichalcogenide, a device was also produced in which the metal dichalcogenide layer was (at a pressure of $10^{-5}$ mbar and a temperature of 230-240° C. for 10 hours) before deposition of the polymer layer. This was done to study the effect of annealing the metal dichalcogenide films on the device performance.

A control device having the structure: glass/ITO/PEDOT:PSS/F8BT:TFB/Ca/Al was also prepared with each batch of devices in order to compare performances with this prior art device.

Figure 3:
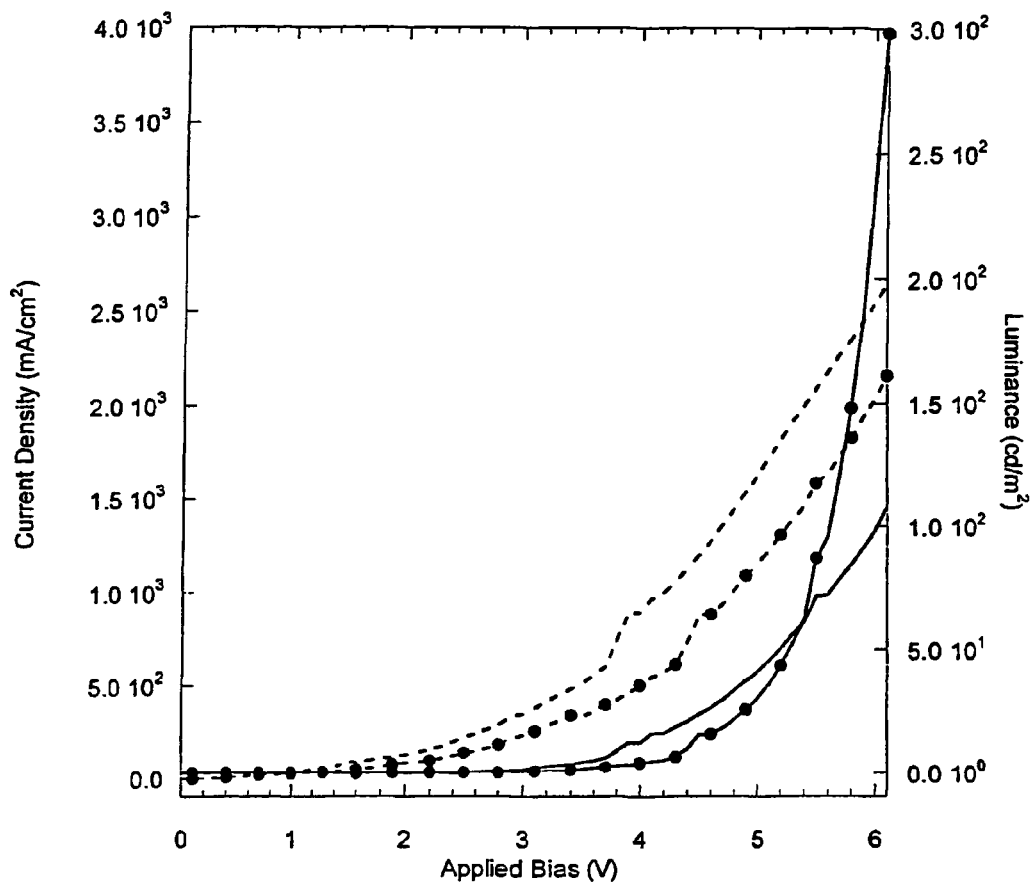
FIGS. 3 to 5 show I-V-L spectra of glass/ITO/$MS_2$/F8BT:TFB/Ca/Al devices according to the present invention.
Figure 4:
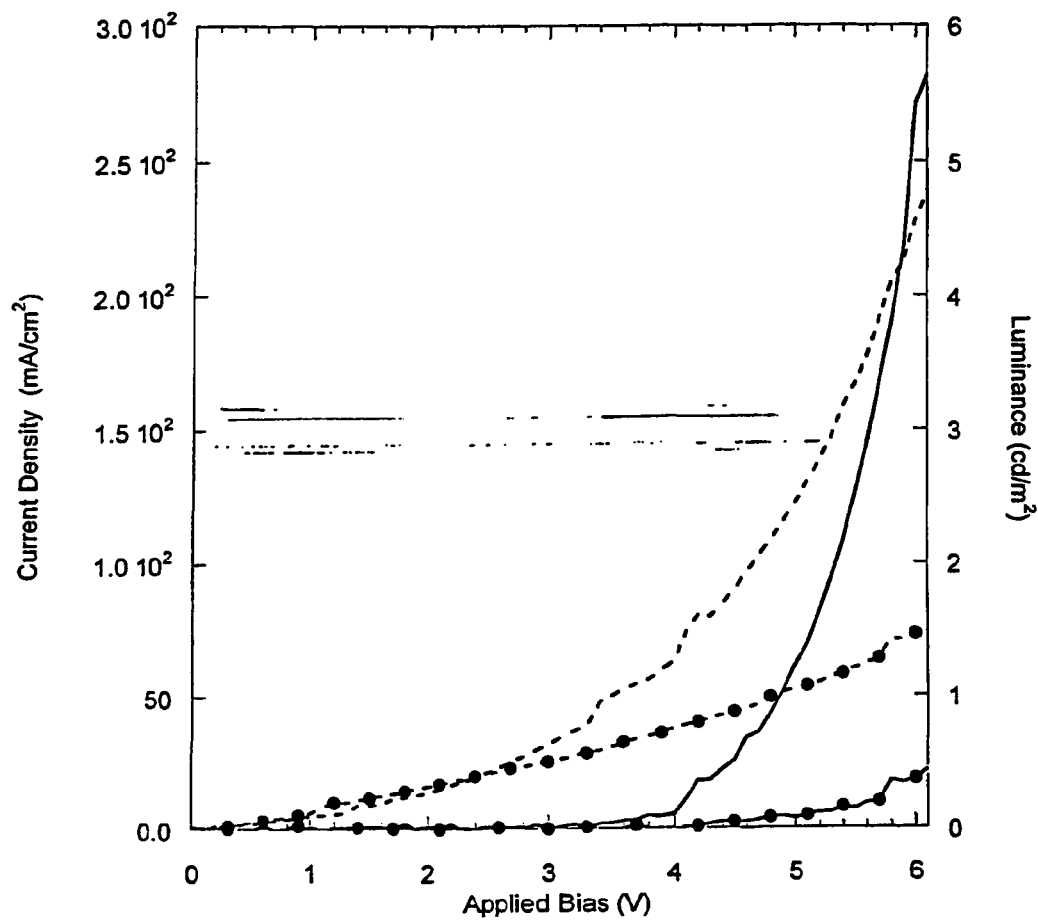
Figure 5:
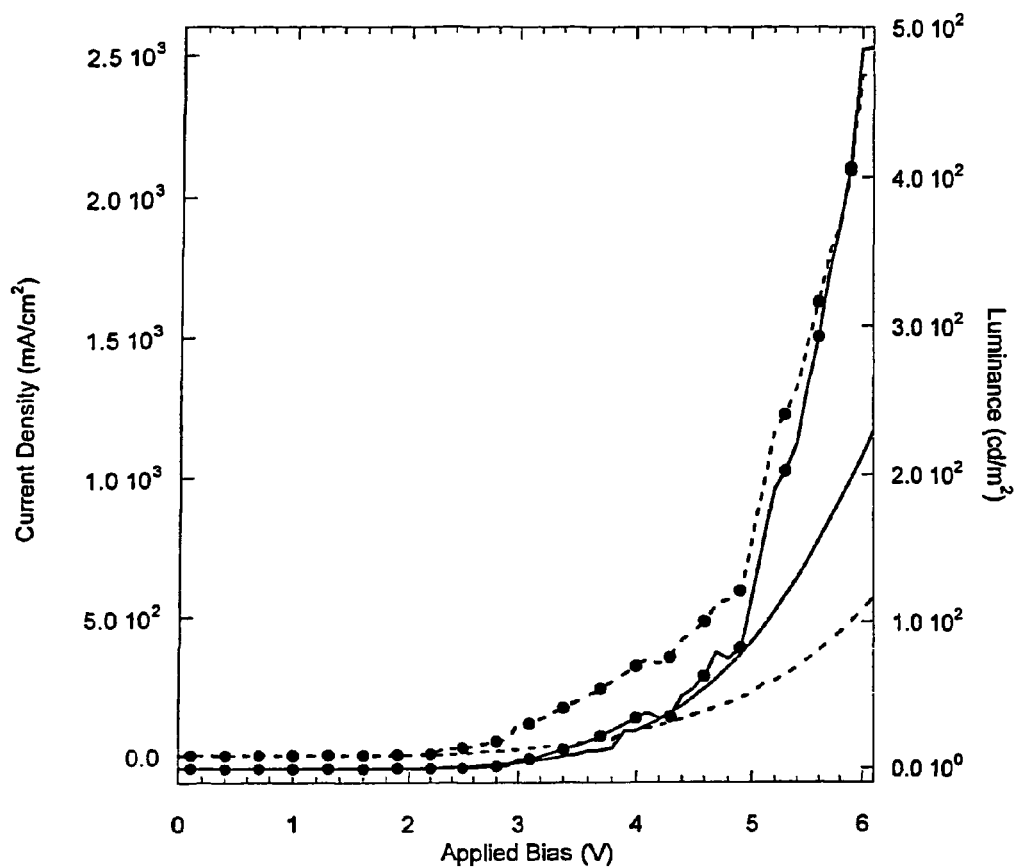

The I-V-L spectra are shown in FIGS. 3 to 5 for 6 devices (3 materials, annealed and unannealed) and the data that can be derived from these are listed in Table 1 below.

TABLE 1

| MX$_2$ material | Current density at 6 V (mA/cm$^2$) | Luminance at 6 V (cd/m$^2$) |
|---|---|---|
| TaS$_2$ unannealed | 68 | 1.4 |
| TaS$_2$ annealed | 250 | 7.0 |
| MoS$_2$ unannealed | 2660 | 110 |
| MoS$_2$ annealed | 2140 | 300 |
| NbSe$_2$ unannealed | 590 | 120 |
| NbSe$_2$ annealed | 2440 | 490 |
| PEDOT-PSS | 1500 | 60000 |

Performance for the device structure shown in FIG. 2 with $MX_2$ as hole transport layer The low current density and luminance values obtained for tantalum disulfide ($TaS_2$) are probably due to the non-continuity of the film observed by both XPS and AFM measurements. The lower current density observed in the device having an annealed molybdenum disulfide ($MoS_2$) layer as compared to that in the unannealed film is due to the metal to semiconductor phase transition that the material undergoes upon annealing [see J. A. Wilson and A. D. Yoffe, *Adv. Phys.* 18, 193 (1969)]. Annealing can be seen to result in an improvement in the luminance of the devices in each case.

Figure 6:
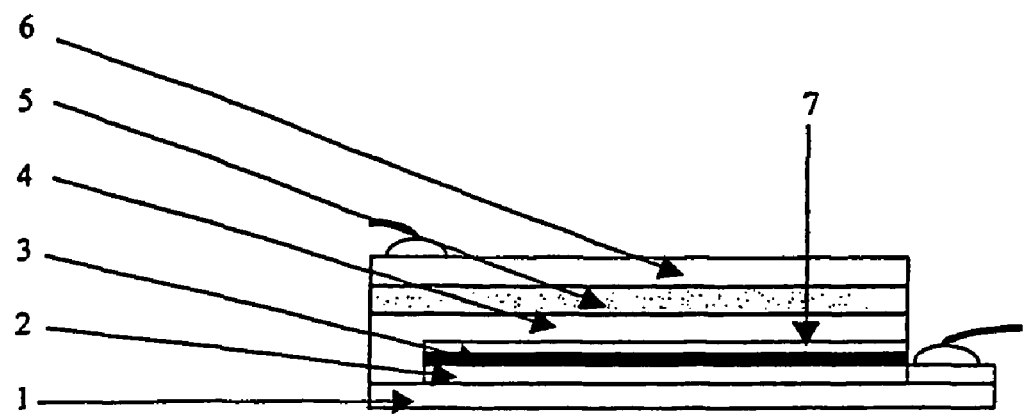
FIG. 6 shows a schematic representation of an electroluminescent device according to the present invention having a layered metal dichalcogenide hole transport layer and a metal oxide electron blocking layer.

In the second set of devices, the metal dichalcogenide layer was treated with oxygen plasma at 250 W for 1, 5, 10 or 20 minutes. This resulted in the formation of a thin metal oxide film on the surface of the metal dichalcogenide layer (7 in FIG. 6). The longer the oxygen plasma treatment, the thicker the metal oxide layer that was produced. As explained above, it was hoped that this would result in an improvement in the electron capturing properties, increasing the electron retention in the light emitting polymer layer and therefore, hopefully, increasing the luminance. In the case of molybdenum disulfide, the composition of the oxide layer is $MoO_3$, while for tantalum disulfide and niobium diselenide, the oxide composition is $Ta_2O_5$ and $Nb_2O_5$ as determined by XPS measurements. As for the first set of devices, for each $MX_2$/MO combination, an additional device was produced in which the metal dichalcogenide layer was annealed. The device structure is shown in FIG. 6 (not to scale).

Figure 7:
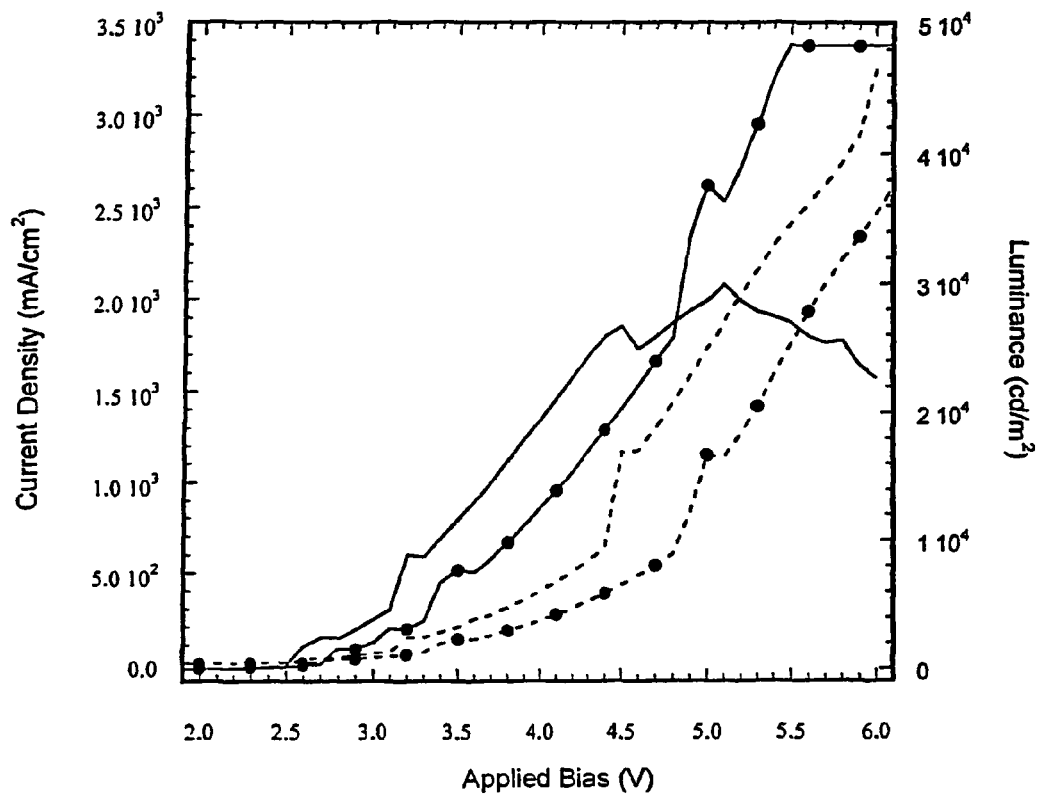
FIG. 7 shows I-V-L spectra of glass/ITO/$NbSe_2$/$Nb_2O_5$/F8BT:TFB/Ca/Al devices according to the present invention.
Figure 8:
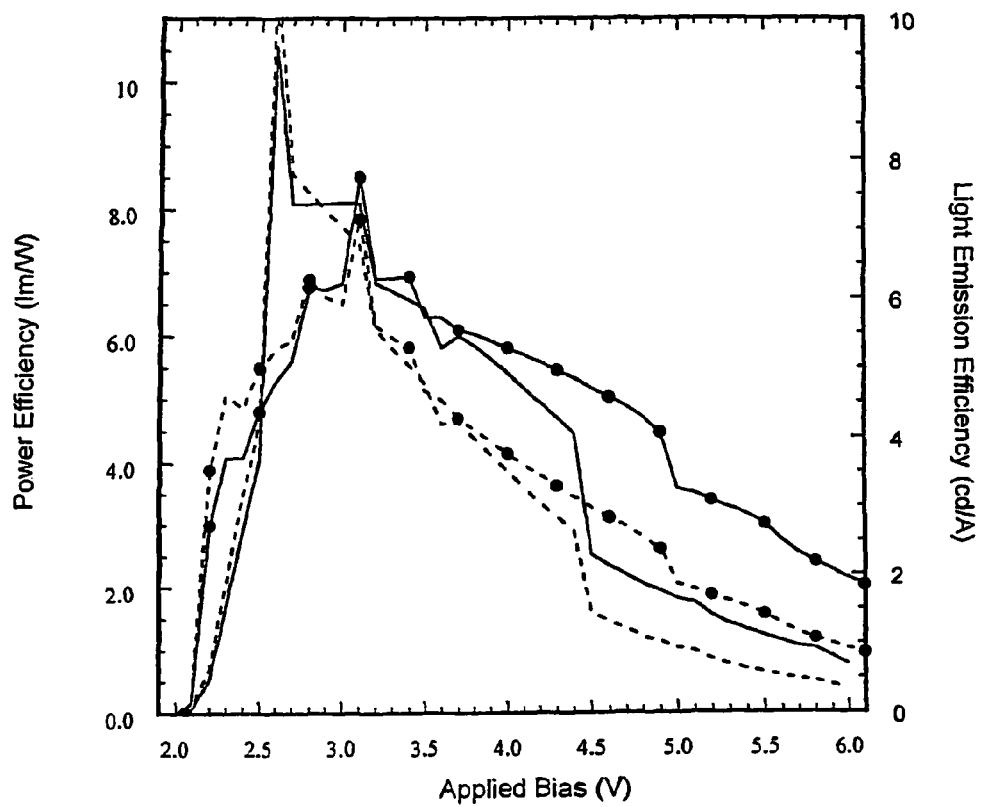
FIG. 8 shows power and light efficiency spectra of glass/ITO/$NbSe_2$/$Nb_2O_5$/F8BT:TFB/Ca/Al devices according to the present invention.
Figure 9:
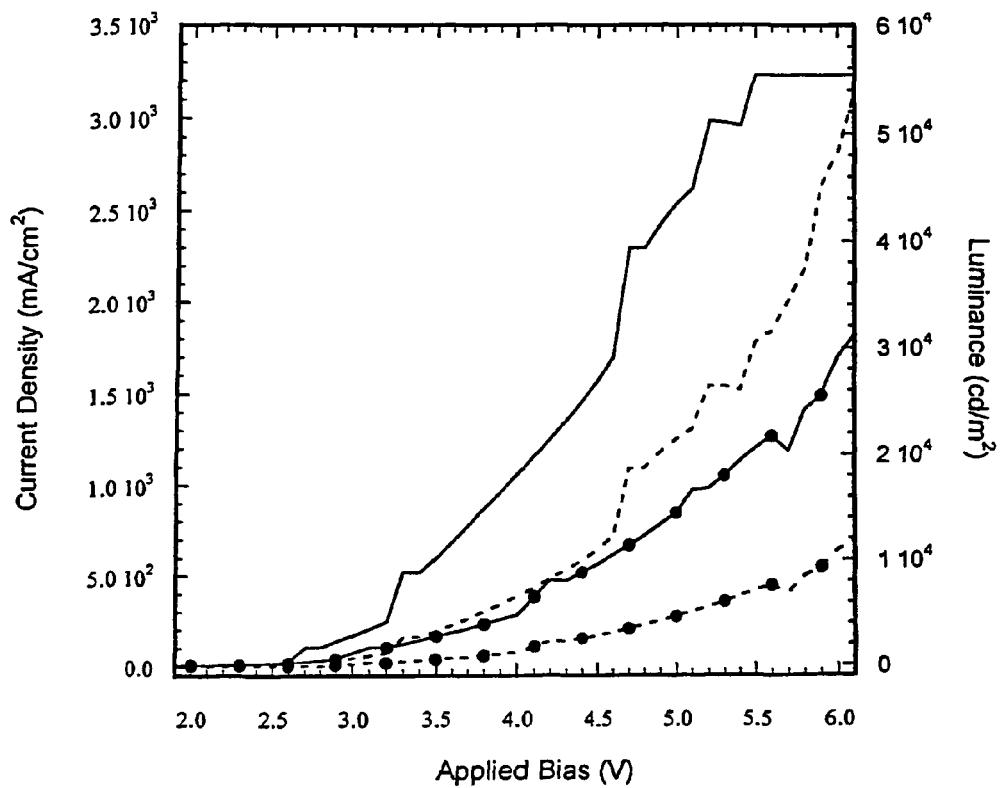
FIG. 9 shows I-V-L spectra of glass/ITO/MoS$_2$/MoO$_3$/F8BT:TFB/Ca/Al devices according to the present invention.
Figure 10:
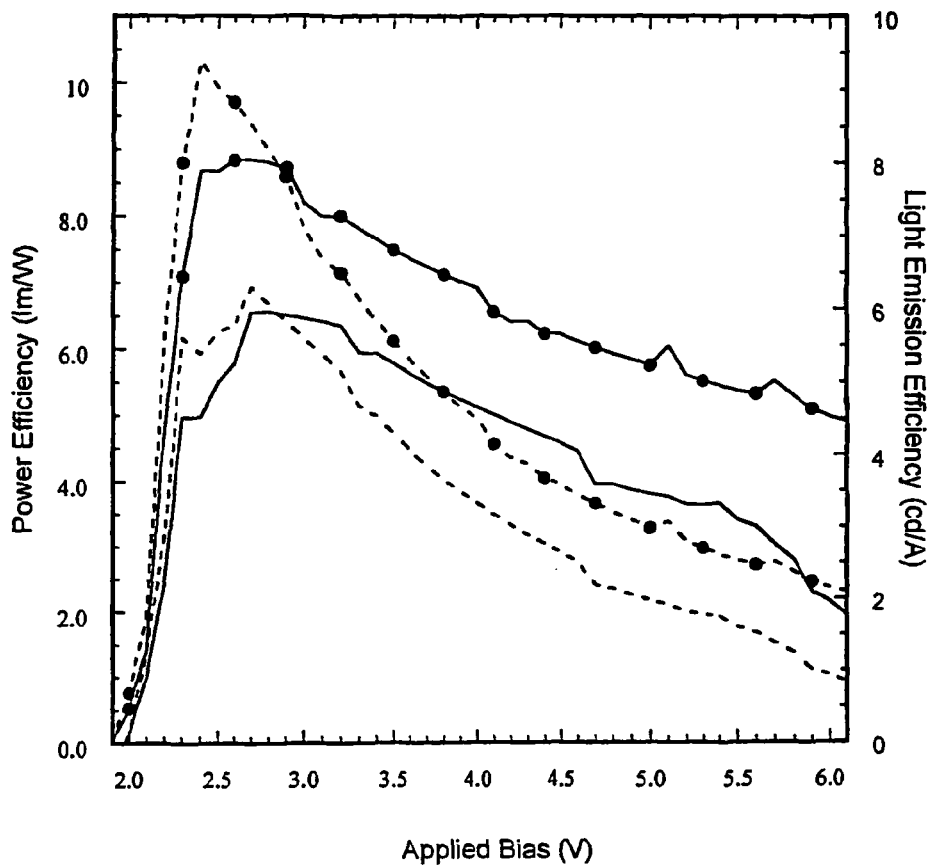
FIG. 10 shows power and light efficiency spectra of glass/ITO/MoS$_2$/MoO$_3$/F8BT:TFB/Ca/Al devices according to the present invention.
Figure 11:
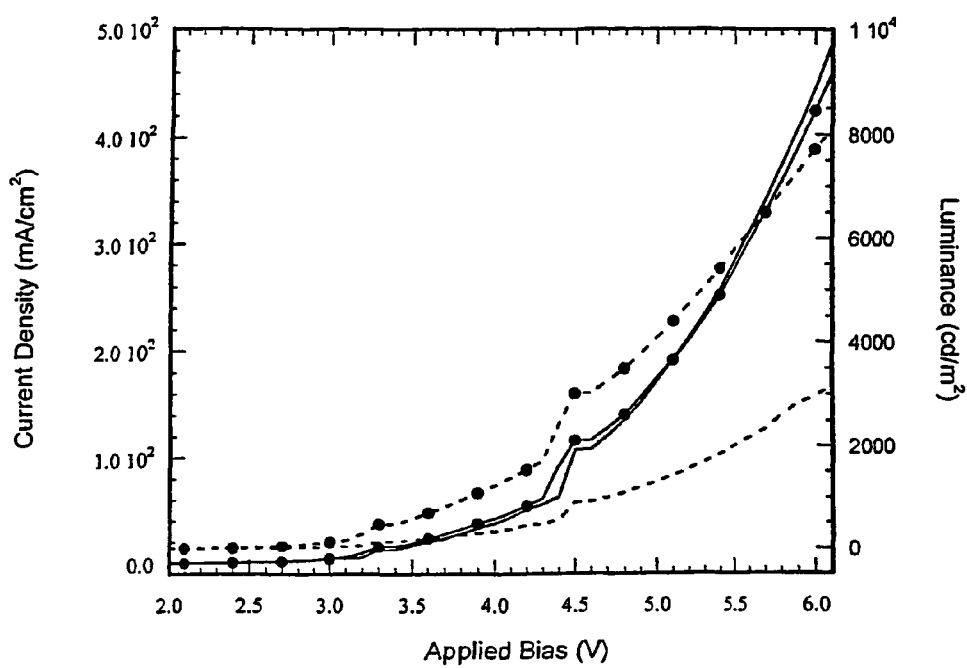
FIG. 11 shows I-V-L spectra of glass/ITO/TaS$_2$/Ta$_2$O$_5$/F8BT:TFB/Ca/Al devices according to the present invention.
Figure 12:
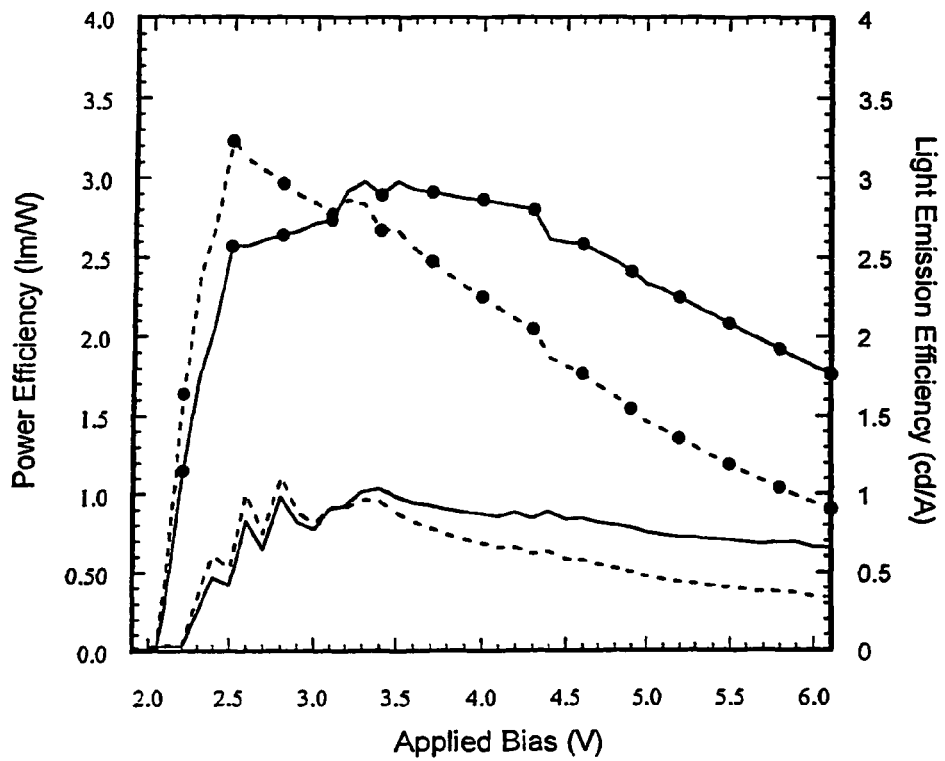
FIG. 12 shows power and light efficiency spectra of glass/ITO/TaS$_2$/Ta$_2$O$_5$/F8BT:TFB/Ca/Al devices according to the present invention.

We found that the annealing of the metal dichalcogenide layer prior to plasma treatment, and the length of the plasma treatment affected the device performance. Selected I-V-L and power spectra are plotted in FIGS. 7-12 (FIGS. 7 and 8 show the results for the niobium-based devices, FIGS. 9 and 10 show the results for the molybdenum-based devices, and FIGS. 11 and 12 show the results for the tantalum-based devices). Data derivable from these spectra are shown in Table 2 below.

Despite the fact that the thickness of the injecting and blocking layers and the blend composition were not optimised, the devices can be seen from the above to exhibit very high light emission and power efficiencies. It is important to point out that no life-time and stability measurements have yet been done. However, since the metal chalcogenides and the corresponding metal oxides are stable at high temperatures (>750° C.), it is expected that these devices will be reasonably stable and long-living.

In conclusion, the results above show that layered metal chalcogenides exhibit several important characteristics that make them highly promising materials for use as hole transport layers in organic electroluminescent devices:
I. High work function
II. Easy chemical (solution) processing
III. Ability to form continues ultra thin films
IV. Simple conversion into the corresponding insulating oxide
V. Stability at high temperatures.
VI. Chemically inert.

The invention claimed is:

1. An electroluminescent device comprising a hole injecting electrode, an electron injecting electrode and at least one organic light emitting layer disposed between said hole injecting electrode and said electron injecting electrode, wherein a layered metal dichalcogenide layer is disposed between said hole injecting electrode and said light emitting layer, wherein the chalcogen component of said layered metal dichalcogenide is selected from the group consisting of sulfur, selenium and tellurium, wherein the metallic component of said layered metal dichalcogenide is selected from the group consisting of titanium, zirconium, hafnium, vanadium, tantalum, niobium, molybdenum and tungsten, and wherein the layered metal dichalcogenide layer has a structure comprising sheets of metal atoms sandwiched between sheets of chalcogen atoms.

TABLE 2

| Material | annealing $MX_2$ at 250° | Oxygen plasma min | Current density at 6 V $mA/cm^2$ | luminance at 6 V $cd/m^2$ | Power efficiency Lm/W | Emission efficiency cd/A |
|---|---|---|---|---|---|---|
| $NbSe_2$ | no | 5 | 1400 | 23000 (31500 at 5.7 V) | 7.9 at 2.8 V | 7.8 at 3.4 V |
| $NbSe_2$ | no | 10 | 3300 | 24000 (30000 at 5.1 V) | 9 at 2.6 V | 7.6 at 2.6 V |
| $NbSe_2$ | no | 20 | 1200 | 27500 | 7.5 at 2.7 V | 7 at 3.2 V |
| $NbSe_2$ | yes | 5 | 500 | 24000 | 7.2 at 3.0 V | 7.5 at 3.7 V |
| $NbSe_2$ | yes | 10 | 2550 | 48000 saturated at 5.5 V | 6.8 at 2.8 V | 6.3 at 3.1 V |
| $NbSe_2$ | yes | 20 | 1100 | 20000 | 5.7 at 2.5 V | 8 at 2.5 V |
| $MoS_2$ | no | 1 | 750 | 31000 | 9.4 at 2.4 V | 8.4 at 2.7 V |
| $MoS_2$ | no | 5 | 2300 | 58000 saturated at 6.0 V | 5.9 at 2.8 V | 5.4 at 2.8 V |
| $MoS_2$ | no | 10 | 3000 | 56000 saturated at 5.5 V | 7 at 2.7 V | 6 at 2.7 V |
| $MoS_2$ | no | 20 | 1000 | 40000 | 7 at 2.4 V | 6 at 2.8 |
| $MoS_2$ | yes | 1 | 1600 | 40000 saturated at 5.6 V | 9.5 at 2.5 V | 7.5 at 2.5 V |
| $MoS_2$ | yes | 5 | 2000 | 50000 saturated at 5.7 V | 7.5 at 2.6 V | 6.5 at 2.6 V |
| $MoS_2$ | yes | 10 | 700 | 20000 | 10 at 2.6 V | 8 at 2.6 V |
| $MoS_2$ | yes | 20 | 1900 | 53000 | 9.5 at 2.4 V | 7.7 at 2.9 V |
| $TaS_2$ | no | 10 | 1400 | 23000 (31500 at 5.7 V) | 10 at 2.6 V | 1.5 at 2.8 V |
| $TaS_2$ | yes | 10 | 3300 | 24000 (30000 at 5.1 V) | 3.2 at 2.5 V | 4.5 at 3.3 V |
| Control Device PEDOT | | | 1400 | 61000 | 10.5 at 2.4 V | 9.4 at 2.9 V |

LED performance for the device structure with $MX_2$ as the hole transport layer and the corresponding metal oxide as an electron blocking layer 2. An electroluminescent device according to claim 1, wherein said layered metal dichalcogenide has a work function of from 4 eV to 6.5 eV.

3. An electroluminescent device according to claim 1, wherein said layered metal dichalcogenide has a work function of from 5 eV to 6.5 eV.

4. An electroluminescent device according to claim 1, wherein said layered metal dichalcogenide has a resistivity of from $1 \times 10^{-4}$ Ω-cm to 10 Ω-cm.

5. An electroluminescent device according to claim 1, wherein the metallic component of said layered metal dichalcogenide is selected from the group consisting of niobium, molybdenum, tantalum and tungsten.

6. An electroluminescent device according to claim 1, wherein the chalcogen component of said layered metal dichalcogenide is selected from the group consisting of sulfur and selenium.

7. An electroluminescent device according to claim 1 wherein said layered metal dichalcogenide is selected from the group consisting of tantalum disulfide, molybdenum disulfide, and niobium diselenide.

8. An electroluminescent device according to claim 1, wherein said layered metal dichalcogenide layer has a thickness of from 3 nm to 20 nm.

9. An electroluminescent device according to claim 1, wherein said layered metal dichalcogenide layer has a thickness of from 3 nm to 10 nm.

10. An electroluminescent device according to claim 1, wherein said layered metal dichalcogenide layer has a thickness of from 3 nm to 7 nm.

11. An electroluminescent device according to claim 1, wherein said organic light emitting layer comprises a layer or layers of one organic light emitting material or a blend of organic light emitting materials, wherein said organic light emitting material or materials is selected from the group consisting of poly-phenylene-vinylene (PPV) and derivatives thereof, polyfluorene and derivatives thereof, polynaphthylene and derivatives thereof, polyindenofluorene and derivatives thereof, polyphenanthrenyl and derivatives thereof, aluminum quinolinol (Alq3) complexes, complexes of transition metals, lanthanides and actinides with organic ligands, and quinacridone, rubrene, and styryl dyes.

12. An electroluminescent device according to claim 1, wherein said organic light emitting layer comprises a layer or layers of one or more organic light emitting materials or a blend of organic light emitting materials, wherein said organic light emitting material or materials is selected from the group consisting of aluminum quinolinol (Alq3) complexes and light emitting conjugated polymeric materials, which can be homopolymers or can contain two or more different conjugated units, wherein said polymers comprise conjugated units selected from the following groups of formulae (VIII), (IX), (X), (XI), (XII), (XIII), (XIV) and (XV):

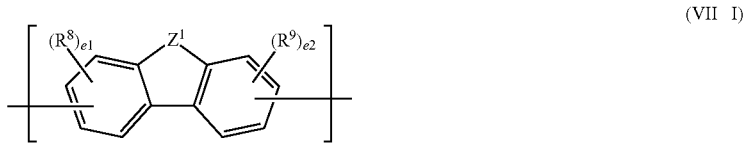

(VIII)

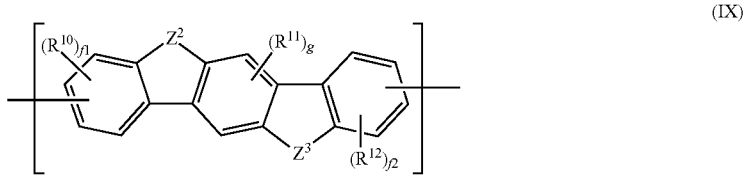

(IX)

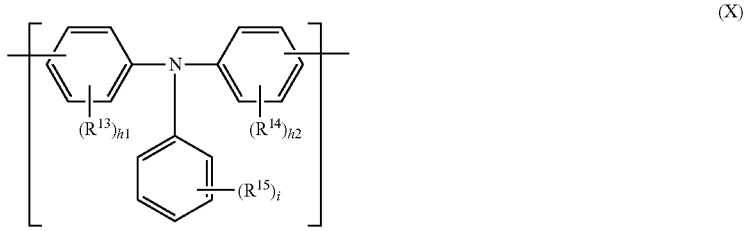

(X)

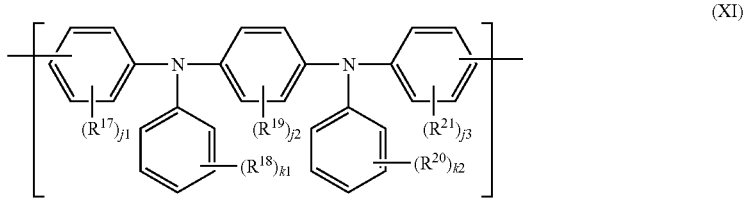

(XI)

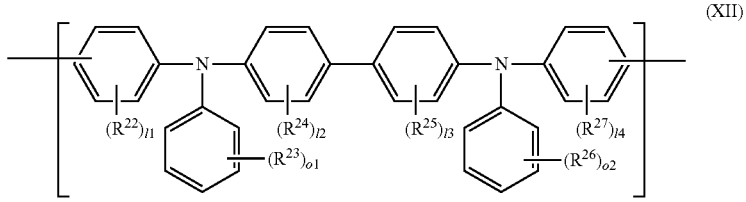

(XII)

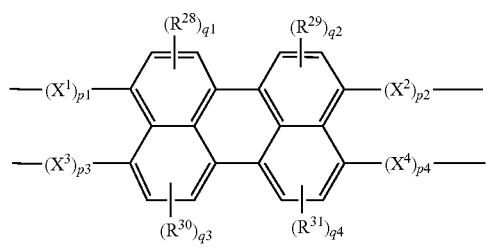

(XIII)

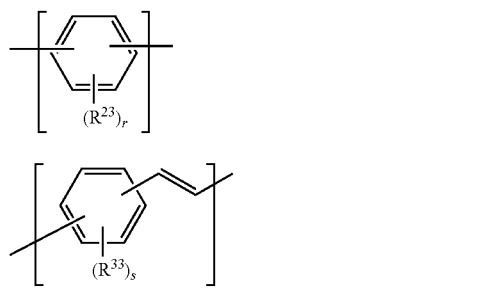

(XIV)

(XV)

wherein:
each of $R^8$ to $R^{15}$ and $R^{17}$ to $R^{33}$ is the same or different and is selected from the group consisting of alkyl groups as defined below, haloalkyl groups as defined below, alkoxy groups as defined below, alkoxyalkyl groups as defined below, aryl groups as defined below, aryloxy groups as defined below, aralkyl groups as defined below and groups of formula —$COR^{16}$ wherein $R^{16}$ is selected from the group consisting of hydroxy groups, alkyl groups as defined below, haloalkyl groups as defined below, alkoxy groups as defined below, alkoxyalkyl groups as defined below, aryl groups as defined below, aryloxy groups as defined below, aralkyl groups as defined below, amino groups, alkylamino groups the alkyl moiety of which is as defined below, dialkylamino groups wherein each alkyl moiety is the same or different and is as defined below, aralkyloxy groups the aralkyl moiety of which is as defined below and haloalkoxy groups comprising an alkoxy group as defined below which is substituted with at least one halogen atom, or, where r or s is an integer of 2, the 2 groups $R^{32}$ or $R^{33}$ respectively may, together with the ring carbon atoms to which they are attached, form a heterocyclic group having from 5 to 7 ring atoms, one or more of said ring atoms being a heteroatom selected from the group consisting of nitrogen, oxygen and sulfur atoms;

each of $Z^1$, $Z^2$ and $Z^3$ is the same or different and is selected from the group consisting of O, S, SO, $SO_2$, $NR^3$, $N^+(R^{3'})(R^{3''})$, $C(R^4)(R^5)$, $Si(R^{4'})(R^{5'})$ and $P(O)(OR^6)$, wherein $R^3$, $R^{3'}$ and $R^{3''}$ are the same or different and each is selected from the group consisting of hydrogen atoms, alkyl groups as defined below, haloalkyl groups as defined below, alkoxy groups as defined below, alkoxyalkyl groups as defined below, aryl groups as defined below, aryloxy groups as defined below, aralkyl groups as defined below, and alkyl groups as defined below which are substituted with at least one group of formula —$N^+(R^7)_3$ wherein each group $R^7$ is the same or different and is selected from the group consisting of hydrogen atoms, alkyl groups as defined below and aryl groups as defined below, $R^4$, $R^5$, $R^{4'}$ and $R^{5'}$ are the same or different and each is selected from the group consisting of hydrogen atoms, alkyl groups as defined below, haloalkyl groups as defined below, alkoxy groups as defined below, halogen atoms, nitro groups, cyano groups, alkoxyalkyl groups as defined below, aryl groups as defined below, aryloxy groups as defined below and aralkyl groups as defined below or $R^4$ and $R^5$ together with the carbon atom to which they are attached represent a carbonyl group, and R6 is selected from the group consisting of hydrogen atoms, alkyl groups as defined below, haloalkyl groups as defined below, alkoxyalkyl groups as defined below, aryl groups as defined below, aryloxy groups as defined below and aralkyl groups as defined below;

each of $X^1$, $X^2$, $X^3$ and $X^4$ is the same or different and is selected from:
arylene groups which are aromatic hydrocarbon groups having from 6 to 14 carbon atoms in one or more rings which may optionally be substituted by at least one substituent selected from the group consisting of nitro groups, cyano groups, amino groups, alkyl groups as defined below, haloalkyl groups as defined below, alkoxyalkyl groups as defined below, aryloxy groups as defined below and alkoxy groups as defined below;
straight or branched-chain alkylene groups having from 1 to 6 carbon atoms; straight or branched-chain alkenylene groups having from 2 to 6 carbon atoms; and straight or branched-chain alkynylene groups having from 1 to 6 carbon atoms; or $X^1$ and $X^3$ together and/or $X^2$ and $X^4$ together can represent a linking group of formula (V) below:

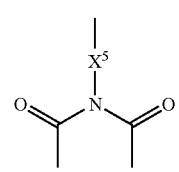

(V)

wherein $X^5$ represents an arylene group which is an aromatic hydrocarbon group having from 6 to 14 carbon atoms in one or more rings which may optionally be substituted by at least one substituent selected from the group consisting of nitro groups, cyano groups, amino groups, alkyl groups as defined below, haloalkyl groups as defined below, alkoxyalkyl groups as defined below, aryloxy groups as defined below and alkoxy groups as defined below;

each of e1, e2, f1 and f2 is the same or different and is 0 or an integer of 1 to 3;

each of g, q1, q2, q3 and q4 is the same or different and is 0, 1 or 2;

each of h1, h2, j1, j2, j3, l1, l2, l3, l4, r and s is the same or different and is 0 or an integer of 1 to 4;

each of i, k1, k2, o1 and o2 is the same or different and is 0 or an integer of 1 to 5; and each of p1, p2, p3 and p4 is 0 or 1;

the alkyl groups above are straight or branched-chain alkyl groups having from 1 to 20 carbon atoms;

the haloalkyl groups above are alkyl groups as defined above which are substituted with at least one halogen atom;

the alkoxy groups above are straight or branched-chain alkoxy groups having from 1 to 20 carbon atoms;

the alkoxyalkyl groups above are alkyl groups as defined above which are substituted with at least one alkoxy group as defined above; and the aryl group above and the aryl moiety of the aralkyl groups (which have from 1 to 20 carbon atoms in the alkyl moiety) and the aryloxy groups above is an aromatic hydrocarbon group having from 6 to 14 carbon atoms in one or more rings which may optionally be substituted with at least one substituent selected from the group consisting of nitro groups, cyano groups, amino groups, alkyl groups as defined above, haloalkyl groups as defined above, alkoxyalkyl groups as defined above and alkoxy groups as defined above.

13. An electroluminescent device according to claim 1, wherein said organic light emitting layer is selected from the group consisting of PPV, poly(2-methoxy-5-(2'-ethyl)hexyloxyphenylene-vinylene) ("MEH-PPV"), dialkoxy and dialkyl derivatives of PPV, polyfluorene derivatives and related copolymers, and Alq3 complexes.

14. An electroluminescent device according to claim 1, wherein a layer of a material is disposed between said organic light emitting layer and said layered metal dichalcogenide layer which is capable of restraining migration of electrons from said organic light emitting layer to said layered metal dichalcogenide layer.

15. An electroluminescent device according to claim 14, wherein said material which is capable of restraining migration of electrons from said organic light emitting layer to said layered metal dichalcogenide layer is an oxide of the same metal as that of the layered metal dichalcogenide layer.

16. An electroluminescent device according to claim 15, wherein said layer of oxide of the same metal as that of said layered metal dichalcogenide layer is formed by oxidizing the exposed surface of the layered metal dichalcogenide layer after it has been deposited on said hole injecting electrode.

17. An electroluminescent device according to claim 15, wherein said layer of oxide of the same metal as that of said layered metal dichalcogenide layer has a thickness of from 1 nm to 10 nm.

18. An electroluminescent device according to claim 15, wherein said layer of oxide of the same metal as that of said layered metal dichalcogenide layer has a thickness of from 2 nm to 6 nm.

19. An electroluminescent device according to claim 15, wherein said layer of oxide of the same metal as that of said layered metal dichalcogenide layer has a thickness of from 2 nm to 3 nm.

20. An electroluminescent device according to claim 1, wherein an electron transport layer is disposed between said electron injecting electrode and said organic light emitting layer.

21. An electroluminescent device according to claim 20, wherein said electron transport layer is selected from the group consisting of strontium oxide, magnesium oxide, calcium oxide, lithium oxide, rubidium oxide, potassium oxide, sodium oxide, and cesium oxide.

22. An electroluminescent device according to claim 1, wherein said hole injecting electrode is formed on a substrate selected from the group consisting of glass, quartz and crystalline substrates of Si, GaAs, ZnSe, ZnS, GaP, and InP.

23. An electroluminescent device according to claim 1, wherein said hole injecting electrode is formed from a material selected from the group consisting of tin-doped indium oxide (ITO), zinc-doped indium oxide (IZO), indium oxide, tin oxide, and zinc oxide.

24. An electroluminescent device according to claim 1, wherein said electron injecting electrode is formed from a material selected from the group consisting of a metal selected from the group consisting of potassium, lithium, sodium, magnesium, lanthanum, cerium, calcium, strontium, barium, aluminum, silver, indium, tin, zinc and zirconium, and binary or ternary alloys containing said metals.

25. An electroluminescent device according to claim 1, wherein said layered metal dichalcogenide is the only hole transporting material.

26. An electroluminescent device according to claim 1, wherein said layered metal dichalcogenide layer is annealed at a temperature of at least 100° C. after the deposition thereof on said hole injecting electrode.

27. A process for the production of an electroluminescent device according to claim 1, which includes the step of depositing said layered metal dichalcogenide on said hole injecting electrode according to the following steps:

(a) intercalating lithium atoms into said metal dichalcogenide;

(b) adding water to the resulting intercalated material resulting in an exfoliation reaction so as to give single layers of said metal dichalcogenide suspended in the water;

(c) adding a water immiscible solvent to the product of step (b) followed by agitating the resulting mixture to give a thin film of the layered metal dichalcogenide at the solvent/water interface; and (d) wetting said hole injecting electrode supported on a substrate and then dipping it into the solvent/water interface produced in step (c) above and allowing the thin film of the layered metal dichalcogenide to spread on the surface of said hole injecting electrode.

28. A process according to claim 27, wherein the step (d) is followed by annealing of the thin film of the layered metal dichalcogenide at a temperature of at least 100° C.

* * * * *

UNITED STATES PATENT AND TRADEMARK OFFICE
CERTIFICATE OF CORRECTION

PATENT NO. : 8,058,797 B2  
APPLICATION NO. : 10/478117  
DATED : November 15, 2011  
INVENTOR(S) : Gitti Frey et al.

Page 1 of 1

It is certified that error appears in the above-identified patent and that said Letters Patent is hereby corrected as shown below:

In the Specification:

At Column 12, line 33, "an an" should be -- an --.

In the Claims:

At Claim 12, Column 19, line 15, Formula (XIV), "$(R^{23})_r$" should be -- $(R^{32})_r$ --.
At Claim 12, Column 20, line 31, "R6" should be -- $R^6$ --.

Signed and Sealed this
Twentieth Day of August, 2013

Teresa Stanek Rea
*Acting Director of the United States Patent and Trademark Office*